May 13, 1969 L. E. AVIS ETAL 3,444,005
THERMOELECTRIC HOT SHOE CONTACTS
Filed Jan. 4, 1965
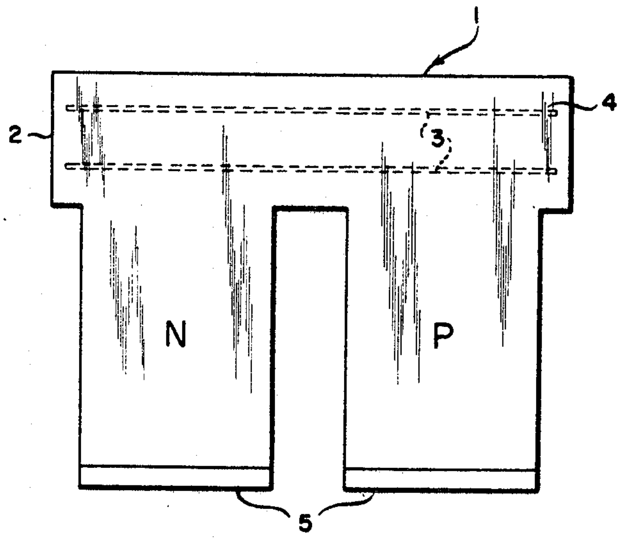
INVENTORS
Leonard E. Avis
Donald B. Evans
BY Littlepage & Quaintance
ATTORNEYS United States Patent Office 3,444,005
Patented May 13, 1969

3,444,005

THERMOELECTRIC HOT SHOE CONTACTS

Leonard E. Avis, Joppatowne, and Donald B. Evans, Baltimore, Md., assignors to Martin-Marietta Corporation, New York, N.Y., a corporation Filed Jan. 4, 1965, Ser. No. 423,229
Int. Cl. H01v 1/12
U.S. Cl. 136—205 10 Claims This invention relates to improved thermoelectric devices and to improved methods of fabricating such devices. More particularly the invention relates to improved hot shoe materials for use at high temperatures and methods for providing a mechanically strong low electrical resistance bond between the hot shoe and the thermoelements of the thermoelectric device.

When two rods of dissimilar thermoelectric compositions have their ends joined to form a continuous loop, two thermoelectric junctions are established between the respective ends so joined. If the two junctions are maintained at different temperatures, an electromotive force will be set up in the circuit thus formed. This effect is called the thermoelectric or Seebeck effect, and may be regarded as due to the charge carrier concentration gradient produced by a temperature gradient in the two materials. The effect cannot be ascribed to either material alone, since two dissimilar, thermoelectrically complementary materials are necessary to obtain this effect. It is therefore customary to measure the Seebeck effect produced by a particular material by forming a thermocouple in which one circuit member or thermoelement consists of this material, and the other circuit member consists of a metal such as copper or lead, which has negligible thermoelectric power. The thermoelectric power (Q) of a material is the open circuit voltage developed by the above thermocouple when the two junctions are maintained at a temperature difference of 1° C.

When thermal energy is converted to electrical energy by means of thermocouple devices utilizing the Seebeck effect, each device may be regarded as a heat engine operating between a heat source at a relatively hot temperature $T_H$ and a heat sink at a relatively cold temperature $T_C$. The limiting or maximum efficiency theoretically attainable from any heat engine is the Carnot efficiency, which is $$\frac{T_H - T_C}{T_H}$$

Thus it is well known that the efficiency of Seebeck effect devices is increased by increasing the temperature difference T between the hot junction temperature $T_H$ and the cold junction temperature $T_C$. It is convenient to operate such Seebeck devices with the cold junction at room temperature, but for any given cold junction temperature it follows that high efficiency in the conversion of thermal energy to electrical energy requires that the hot junction temperature $T_H$ be as high as possible.

Many thermoelectric compositions which are useful at relatively low temperature cannot be operated at elevated temperatures because they tend to break down or react with the environment when heated to high temperatures. It is therefore necessary for highly efficient Seebeck devices to utilize only those thermoelectric compositions which are stable at elevated temperatures. In the same manner all of the components of a thermoelectric device in contact with the high temperature source, including the hot shoe junction between the thermoelements, should be able to operate effectively at the highest temperatures possible in order to (1) maintain the highest temperature difference possible between the hot junction temperature $T_H$ and the cold junction temperature $T_C$, (2)

maintain a continuous electrical circuit between the components, and (3) maintain the lowest electrical resistivity in the components and in the thermoelectrical system as a whole.

In the discussion that follows and in the claims the common conductor that connects the thermoelements on the end exposed to the heat source will be referred to interchangeably as the hot shoe and as the common conductor. It should also be understood that the thermoelements will be composed of known standard formulations of thermoelectrically complementary materials, known in this art, and that the term thermoelectrically complementary preferably refers to the N-type and P-type elements required to form an effective thermoelectric device. The methods of doping such materials are well known.

In most thermoelectric devices the junction bonds between the hot shoe and the thermoelectrically complementary elements decompose at high tempreatures and the relatively high resistances at the junctions tend to increase. The most common method of forming this junction is by brazing the ends of the thermoelements to a common conductor such as copper with a bonding material that will establish a thermoelectric junction between them. In joining P and N elements to the hot shoe it is difficult to obtain and maintain good electrical and thermal conductivity at high temperatures, and it is difficult to achieve strong bonds that do not rapidly deteriorate when operated at high temperatures. The basic problem and primary mechanism of bond degradation is caused by physical and/or chemical decomposition of the bond when the hot shoe is exposed to high heat sources. Another problem has been the increase in electrical resistances at the junctions created by the bonding material which prevents the device from developing an adequate electrical current.

A primary object of this invention is to provide a hot shoe thermoelectric contact bond between complementary thermoelements that will not alloy with nor dissolve in electrical conductors when subjected to high temperatures.

Another object of this invention is to provide a hot shoe thermoelectric contact bond of the afore-mentioned character having a contact of low electrical resistance which will allow the generation of higher electric currents at high temperatures.

Another object of this invention is to provide a hot shoe of the afore-mentioned character in which the junctions between the hot shoe and the thermoelectric elements are mechanically strong and maintain adequate strength at high temperatures over long periods of operation.

Another object of this invention is to provide thermoelectric devices of the afore-mentioned character having an improved hot shoe connected between two complementary thermoelements.

Other objects and advantages will hereinafter be mentioned or will become apparent to those skilled in the art from the following description and drawing illustrating an embodiment of the invention.

According to the present invention a much more effective, durable, and electrically conductive hot shoe bond for high temperature thermoelectric devices is obtained when conducting materials such as metallic wires or fibers are embedded in a semiconducting shoe material that has physical, chemical and electrical properties similar in character to the semiconductor thermoelements used in the thermoelectric device.

We have conducted many tests using various hot shoe materials and various bonding materials to discover how to produce more durable high temperature thermoelectric devices. These tests have shown that when a ductile metallic shoe is joined to the thermoelements using a brittle intermetallic semiconductor bonding material and subjected to high temperatures the bond between these dissimilar materials physically and/or chemically deteriorates. Furthermore, semiconducting materials have (in addition to known) inherently relatively high electrical resistivity and low strength which makes them undesirable hot shoe materials.

Further tests show that when semiconductor materials were placed between the thermoelements and a copper conductor and subjected to high temperatures the copper and semiconductor material chemically reacted and the efficiency of the thermoelectric devices greatly decreased.

Other tests have shown that very efficient high temperature hot shoe bonds having good electrical conductivity and high temperature contact strength are obtained when metallic materials such as fibers, screens, etc., are embedded in a semiconductor shoe material. The semiconducting shoe material is more similar in physical, chemical and electrical character to the semiconducting thermoelectric elements, thus the junctions are more chemically and physically stable, have lower electrical resistance and much slower rates of degradation at high operating temperatures. The semiconductor shoe material prevents the metallic fibers from coming into direct physical contact with the thermoelectric elements and physically holds the metallic fibers firmly in place. The metallic fibers in turn increase the electrical conductivity and increase the physical strength of the hot shoe.

A device illustrating the invention is shown in the drawing which shows a thermoelectric device, having complementary thermoelectric elements N and P connected to a hot shoe 2 which contains metallic material (fibers) 3, embedded within a semiconductor material 4. A conventional cold shoe 5 is attached to the cold end of each thermoelement and in use each cold shoe is connected in a known manner to a desired load which is not shown.

The complementary thermoelectric elements (N and P) may be doped PbTe or PbSnTe of standard known formulations, or they may be composed of any other known combination of N and P type semiconductor thermoelement compositions suitable for high temperature use.

The metallic material 3 embedded within the semiconductor material 3 of hot shoe 2 should be in the form of fibers, wires, screens, perforated foil, etc., or a combination of two or more of these metallic materials. In order to obtain the most desirable physical connection the metal fibers 3 are physically intermeshed in the semiconductor material 3. The number and spacing of the fibers or perforations can be varied to control the resistance, thickness, and strength of the hot shoe. The metallic material 3 may be composed of any electrical conducting metal that is compatible with the hot shoe semiconductor material 4 such as iron, stainless steel, molybdenum, W, Ta, Zr, and Ti, etc. Copper and nickel should not be used with PbTe and SnTe, which are two preferred semiconductor shoe materials, because they severely react with these semiconductors. The specific metal fiber used should be correlated with the semiconductor material used in the hot shoe to obtain the best combination of conductivity and chemical and physical stability at the chosen high hot shoe operating temperatures.

The hot shoe semiconductor material 4 is desirably one that has pyhical, chemical and electrical properties similar to those of the thermoelements. For example, if the thermoelement is PbTe or PbSnTe, the hot shoe material 4 should be either SnTe or PbSnTe. Using these materials produced especially strong bonds that resisted deterioration at high temperatures, but obviously other combinations of complementary thermoelements are readily visualized by those skilled in the art.

The cold shoe material 5 may be composed of any known cold shoe material, such as iron, copper, etc., and may be bonded to the thermoelectric elements in any known manner, such as by bonding the iron shoe to the thermoelements using a Ni or Sn bonding material.

A preferred general method of making the thermoelectric device of this invention employs the powder metallurgical techniques described below. It should be readily understood that various process modifications and materials may be used. The specific materials used illustrate a preferred combination of materials that produced unusually durable hot shoes for use with high heat sources. Other known thermoelectric materials can be used as substitutes.

The hot shoe 2 was formed by cold compacting SnTe powder around a number of metal fibers, wires, screens, or perforated foils in a steel die. Various cold compacting techniques for compacting powdered materials are well known in the art. The metallic fibers most suitable for use in combination with SnTe are iron, stainless steel and molybdenum, but other metals can be used. Standard formulations of doped PbSnTe powder were cold compacted in a steel die to form the N and P thermoelectric elements. Conventional iron cold shoes were attached to the N and P thermoelements using Ni or Sn as the bonding material. The precold pressed hot shoes and the metallic cold shoes were attached to the N and P thermoelements by hot pressing the thermocouple unit in a die of graphite or the like under an inert gaseous atmosphere such as an argon atmosphere at a temperature of 1400–1450° F. and a pressure of 2.5 tons per square inch.

The aforedescribed hot casting step should be carried out in crucibles which do not react with or contaminate the thermoelectric compositions, since minor amounts of undesired impurity may very deleteriously affect the electrical and/or physical properties of the elements. The preferred crucibles are those made of carbon, pre-fired lavite or quartz.

To illustrate the decrease in bond degradation obtained by using the hot shoe bonding process of this invention, the following prototype samples were produced, and tested along with the best known conventional hot shoe. The three devices were tested at an operating temperature of 900° F.

Three pair of N and P elements were made for use with the hot shoes that were tested. The N thermoelements consisted of 8 grams of PbTe containing a dopant concentration of 0.06 weight percent $PbI_2$ and 5.5 weight percent tin. The P thermoelements consisted of 8 grams of PbTe containing a dopant concentration of 0.06 weight percent Na. All of the elements were initially cold prepressed at 20 t.s.i.

Prototype hot shoe A was made by filling a steel die 1 x ½" with 2.5 grams of minus 100 mesh SnTe. A pretinned iron screen of 60 mesh was placed on top of the powder leaving a border of $\frac{1}{16}$" of SnTe on all sides. A second layer of 2.5 grams of SnTe was poured on the screen and a second screen placed over it in a similar manner. Then a third layer of 2.5 grams SnTe was added. The shoe was then cold pressed at 20 t.s.i. The N and P elements were then bonded to the hot shoe by adding 0.5 gram of N and P material to the inner face and pressing at 2.5 t.s.i. for 20 minuntes at 1400° F.

Prototype hot shoe B contained pre-tinned iron rods ¾" long and $\frac{3}{32}$" diameter of which one to five are imbedded ni the SnTe layers (with three being the maximum per layer). The two screens are primarily to improve the strength of the shoe, the rods are used mainly to improve the conductivity of the shoe. The resistivity of the shoe was reduced from 0.40 mΩ of the prototype A to 0.07 mΩ for prototype B.

Performance data of couples under operating conditions is tabulated below. The fact that the N element contribution to the total power output of the prototype A degraded only 4.2% and prototype B zero precent indicates that excellent bonds were obtained with the N element. Furthermore the fact that visual examination showed no degrading of the P element bonds (in contrast with the readily visual noticeable deterioration of the bonds of conventional couples) indicates that degrading of the SnTe couple total output may be primarily due to he P material itself. It has been noticed that the most severe degradation of conventional couples has taken place in the P elements and preliminary tests on the P elements (unbonded) seem to confirm that the P material itself is affected by thermal cycles.

| | SnTe Couple, Prototype A (W/2 screens) | SnTe Couple, Prototype B (W/2 screens, 3 wires) | Standard Couple, 0.2″ hot shoe of Ferrovac E (best conventional shoe) |
|---|---|---|---|
| Resistance: (Hot shoe): | | | |
| 75° F. Before test, mΩ | 0.22 | 0.08 | 0.1 |
| 75° F. After test, mΩ | 0.30 | N.A. | 0.2 |
| 900° F. operating temperature beginning of test, mΩ | 1.8 | 0.3 | 0.2 |
| 900° F. After test, mΩ | [1] 1.9 | [2] 0.2 | [3] 0.19 |
| Total Couple Resistance: | | | |
| Before test, mΩ | 3.1 | 2.81 | 2.16 |
| After test, mΩ | 5.70 | ------------- | 12.90 |
| Maximum Power, watts | 0.486 | 0.555 | 0.555 |
| Power Loss, percent of total in hot shoe (900° F.): | | | |
| Start of test, percent | 9.8 | 1.4 | 1.6 |
| End of test, percent | [4] 7.5 | [5] 3.8 | [3] 1.1 |
| Percent Degradation: | | | |
| Couple, percent | 12.7 | 14 | 59.8 |
| P leg, percent | 29.1 | 35 | 79.3 |
| N leg, percent | [4] 4.2 | [5] 0 | [3] 43.8 |

[1] 264 hours.
[2] 144 hours still in test.
[3] 168 hours.
[4] 250 hours.
[5] 144 hours.

The above tests show that the degration of the conventional hot shoe far exceeded the degradation of prototype A and B.

The foregoing discussion makes it apparent that many variations may be made in the illustrative details of this invention without departing from the spirit of the invention or the scope thereof as defined in the appended claims.

What is claimed is:

1. A thermoelectric device for high temperature operation comprising two thermoelements of thermoelectrically complementary material said thermoelements being joined at one end by a common conductor to form a high temperature thermoelectric junction, said common conductor comprising (1) a semiconductor shoe material having physical chemical and electrical properties that are similar to the physical, chemical and electrical properties of said thermoelements, and (2) metallic material embedded in said semiconductor shoe material to increase the electrical conductivity and strength of said shoe.

2. An improvement in a thermocouple comprising complementary N and P elements connected by a semiconductor shoe, said shoe having electrically conductive metallic material embedded therein to increase the electrical conductivity and strength thereof.

3. The hot shoe of claim 2, wherein said metallic material is in a form selected from the group consisting of metal fibers, metal wires, metal screens and perforated metal foils.

4. The hot shoe of claim 3, wherein said semiconductor shoe material is SnTe.

5. The hot shoe of claim 3, wherein said semiconductor shoe material is PbSnTe.

6. The thermoelectric device of claim 1, wherein said metallic material is in a form selected from the group consisting of metal fibers, metal wires, metal screens, and perforated metal foils.

7. The thermoelectric device of claim 6, wherein said complementary thermoelements are an N-type and a P-type doped PbTe, and said semiconductor shoe material is SnTe.

8. The thermoelectric device of claim 6, wherein said complementary thermoelements are N-type and P-type doped PbSnTe, and said semiconductor shoe material is SnTe.

9. The thermoelectric device of claim 6, wherein said complementary thermoelements are an N-type and a P-type doped PbTe, and said semiconductor shoe material is PbSnTe.

10. The thermoelectric device of claim 6, wherein said complementary thermoelements are an N-type and a P-type doped PbSnTe, and said semiconductor shoe material is PbSnTe.

References Cited

UNITED STATES PATENTS 3,072,733 1/1963 Sasaki et al. -------- 136—239
3,269,871 8/1966 Kilp et al. ---------- 136—203
3,279,955 10/1966 Miller et al. --------- 136—205

WINSTON A. DOUGLAS, *Primary Examiner.*

DONALD L. WALTON, *Assistant Examiner.*

U.S. Cl. X.R.

136—236, 239